US005903169A

United States Patent [19]
Kong

[11] Patent Number: 5,903,169
[45] Date of Patent: May 11, 1999

[54] CHARGE RECYCLING DIFFERENTIAL LOGIC (CRDL) CIRCUIT AND STORAGE ELEMENTS AND DEVICES USING THE SAME

[75] Inventor: Bai-Sun Kong, Nowon-gu, Rep. of Korea

[73] Assignee: LG Semicon Co., Ltd., Cheongju, Rep. of Korea

[21] Appl. No.: 08/775,951

[22] Filed: Jan. 3, 1997

Related U.S. Application Data

[60] Provisional application No. 60/022,565, Jul. 24, 1996.
[51] Int. Cl.[6] .................................................. H03K 19/096
[52] U.S. Cl. ............................................. 326/95; 326/121
[58] Field of Search ................................. 326/83, 98, 58, 326/27, 28, 95, 59, 60; 327/56, 67, 218, 219, 223

[56] References Cited

U.S. PATENT DOCUMENTS

| | | | |
|---|---|---|---|
| 3,796,893 | 3/1974 | Hoffman et al. | 326/83 |
| 4,169,233 | 9/1979 | Haraszti | 326/83 |
| 4,561,702 | 12/1985 | McAdams | 326/83 |
| 4,734,597 | 3/1988 | Ullrich et al. | 326/93 |
| 5,049,763 | 9/1991 | Rogers | 326/27 |
| 5,162,681 | 11/1992 | Lee | 326/83 |
| 5,594,361 | 1/1997 | Campbell | 326/24 |

OTHER PUBLICATIONS

Kawahara, T., et al., "A Charge Recycle Refresh for Gb–Scale DRAM's in File Applications," IEEE J. Solid–State Circuits, vol. 29, No. 6, Jun. 1994, pp. 715–722.

Younis and Knight, "Practical Implementation of charge recycling Asymptotcally zero powr CMOS," Research on integrated systems; Proc. 1993 Symp., Cambridge, MA 1993.

Younis and Knight, "Practical Implementation of Charge Recovering Asymptotically Zero Power CMOS," Research on Integrated Systems; Proc. 1993 Symp., Cambridge, MA 1993.

*Primary Examiner*—Michael J. Tokar
*Assistant Examiner*—Don Phu Le
*Attorney, Agent, or Firm*—Fleshner & Kim

[57] ABSTRACT

A storage element for a semiconductor device in accordance with preferred embodiments exhibit less noise and consumes less power with faster speed. A first circuit maintains a first storage node at a same signal level of a previous state when an input signal at an input electrode transits from one of (i) first signal level to second signal level and (ii) third signal level to second signal level. The first circuit includes a first plurality of transistors coupled to the input electrode, and a first pair of transistors coupled to said first plurality of transistors and coupled to each other at the first storage node. A second circuit, coupled to said first circuit, changes a condition of said first storage node to one of (i) first signal level when the input signal transits from the second signal level to the first signal level and (ii) third signal level when the input signal transits from the second signal level to the third signal level.

31 Claims, 13 Drawing Sheets

| a | b | XOR OUT | XNOR /OUT |
|---|---|---------|-----------|
| 0 | 0 | 0 | 1 |
| 0 | 1 | 1 | 0 |
| 1 | 0 | 1 | 0 |
| 1 | 1 | 0 | 1 |

| a | b | AND OUT | NAND /OUT |
|---|---|---------|-----------|
| 0 | 0 | 0 | 1 |
| 0 | 1 | 0 | 1 |
| 1 | 0 | 0 | 1 |
| 1 | 1 | 1 | 0 |

| | 1 | 2 | 3 | 4 | 5 |
|---|---|---|---|---|---|
| A | D | Vss | 1/2 Vdd | Vdd | 1/2 Vdd |
| B | Eo | H | L | H | L |
| C | 61 | ON | ON | OFF | ON |
| D | 62 | OFF | OFF | ON | ON |
| E | 63 | ON | OFF | ON | OFF |
| F | node A | H | H | L | L |
| G | 64 | OFF | ON | ON | ON |
| H | 65 | ON | OFF | ON | OFF |
| I | 66 | ON | ON | OFF | OFF |
| J | OUT | L | L | H | H |

FIG.7B

|   | 1 | 2 | 3 | 4 | 5 |
|---|---|---|---|---|---|
| A | D | Vss | ½ Vdd | Vdd | ½ Vdd |
| B | /D | Vdd | ½ Vdd | Vss | ½ Vdd |
| C | Eo | H | L | H | L |
| D | P1 | ON | ON | OFF | ON |
| E | N1 | OFF | ON | ON | ON |
| F | N2 | ON | OFF | ON | OFF |
| G | node A | H | H | L | H |
| H | node B | H(Vdd−VthN2) | L | L | L |
| I | P2 | OFF | OFF | ON | OFF |
| J | N3 | ON | OFF | OFF | OFF |
| K | P3 | OFF | ON | ON | ON |
| L | N4 | ON | ON | OFF | ON |
| M | S1 or OUT | L | L | H | H |
| N | P4 | OFF | OFF | ON | ON |
| O | N5 | ON | ON | OFF | OFF |
| P | P5 | ON | ON | OFF | OFF |
| Q | N6 | OFF | OFF | ON | ON |
| R | S2 or /OUT | H | H | L | L |

FIG.8C

|   | 1 | 2 | 3 | 4 | 5 |
|---|---|---|---|---|---|
| A | D | Vss | ½ Vdd | Vdd | ½ Vdd |
| B | /D | Vdd | ½ Vdd | Vss | ½ Vdd |
| C | Eo | H | L | H | L |
| D | P1 | ON | ON | OFF | ON |
| E | N1 | OFF | ON | ON | ON |
| F | N2 | ON | OFF | ON | OFF |
| G | node A | H | H | L | H |
| H | node B | H(Vdd−VthN2) | L | L | L |
| I | P2 | OFF | OFF | ON | OFF |
| J | N3 | ON | OFF | OFF | OFF |
| K | P3 | OFF | ON | ON | ON |
| L | N4 | ON | ON | OFF | ON |
| M | N2' | ON | OFF | ON | OFF |
| N | P2' | ON | OFF | ON | OFF |
| O | node C | L | H | H | H |
| P | node D | L | L | H(Vdd−VthN2') | L |
| Q | N3' | OFF | OFF | ON | OFF |
| R | P4 | OFF | OFF | ON | ON |
| S | N5 | ON | ON | OFF | OFF |
| T | P5 | ON | ON | OFF | OFF |
| U | N6 | OFF | OFF | ON | ON |
| V | S1 or OUT | L | L | H | H |
| W | S2 or /OUT | H | H | L | L |

CHARGE RECYCLING DIFFERENTIAL LOGIC (CRDL) CIRCUIT AND STORAGE ELEMENTS AND DEVICES USING THE SAME

This is a regular application based on a provisional application under 37 CFR 1.53(b)(2) having Serial No. 60/022,565 filed Jul. 24, 1996, and this regular application claims priority thereof.

TECHNICAL FIELD

The present invention relates to a novel logic cell, and more particularly, to a storage element or a latch using the novel logic cell.

Background Art

VLSI technology allows powerful hardware for sophisticated computer applications and multimedia capabilities, such as real-time speech recognition and full-motion video. Recent changes in the computing environment have created a variety of high speed electronics applications. However, there is an increased user desire for portability of computational equipment, which places severe restrictions on size, weight, and power. Power consumption is a major consideration in mobile applications, since a number of portable applications require low-power and highthroughput, simultaneously. For example, notebook and laptop computers require almost the same computational speed and capabilities as desktop machines. Equally demanding are developments in personal communications services (PCS's), such as the digital cellular telephony networks which employ complex speech compression algorithms and sophisticated radio modems.

Further, more power is required for the portable multimedia systems supporting full-motion digital video. Power for video compression and decompression and speech recognition is required on top of the already lean power budget. These portable systems have increased capabilities than fixed workstations, and are required to operate in a low power portable environment.

Even in non-portable systems, low power consumption is becoming more important. Until recently, power consumption has not been a great concern since the heat generated on-chip can be sufficiently dissipated using a proper package. However, the reduction in the minimum feature size allows implementation of more functional units in a single chip by increasing the number of integrated transistors.

These functional units are usually computation-intensive and operating concurrently, and power consumption increases dramatically in complex VLSI systems, such as high performance microprocessors and general-purpose digital signal processors PSP's). Since the power dissipated in a CMOS digital circuit is proportional to the clock frequency, higher operational speed further increases power consumption.

Further, some adequate cooling techniques, such as using fins and fans, are required to handle increased internal heat. Such techniques increase cost and/or limit the amount of functionalities which can be integrated in a single chip. Hence, reducing power consumption has become a critical concern for designing complex VLSI systems.

There are a variety of considerations that must be taken into account for low power design, which include the style of logic used, the technology incorporated, and the architecture employed. Among these, choosing a proper logic style is an important factor for low power, since the power consumed in the arithmetic and logical units is greatly dependent on the way in which these blocks are implemented. The logic circuit choice also affects the architectural selection. Hence, there is a need for full exploitation of existing logic circuits to optimize and to create a new logic circuit for low power operation.

There are a number of options available in choosing the basic circuit approach and topology of implementing various logic and arithmetic functions. In general, logic families can be divided into two broad categories, depending on the type of operation. The first category is a static logic circuit including standard CMOS logic and pass-transistor logic, in which all the internal nodes are static, and thus, noise margin is high. The second category is a dynamic logic circuit which uses a precharge technique to improve speed performance. However, the cost increases due to higher design complexity in order to eliminate the problems, such as charge sharing due to dynamic operation. U.S. application Ser. No. 08/688, 881, which is commonly assigned to the same assignee of this application, describes and illustrates the numerous problems of different static and dynamic logic circuits. The disclosure of U.S. application Ser. No. 08/688,881 is incorporated herein by reference.

Although the conventional logic circuits attempt to reduce the amount of charge consumed in each cycle, power consumption is large, since the charge is repeatly moved from the supply voltage to the ground voltage within a given cycle. Younis and Knight at MIT proposed a method of charge recovering via a new logic family, called Charge Recovering Logic (CRL), which was described in the articles entitled "Practical implementation of charge recycling Asymptotically zero power CMOS," Research on integrated systems; Proc. 1993 Symp., Cambridge, Ma. 1993.

The charge recovery technique can achieve energy saving of over 99% when the devices are switched sufficiently slowly. The concept is to create a mirror image of a circuit that computes the inverse of the original, as shown in FIG. 1A. As each stage in the circuit finds an answer, it passes the result on to its mirror image which computes the inverse. In the main circuit charge moves toward the end, while charge is recycled back to the beginning in the mirror circuit. However, the logic design for implementing the CRL is quite impractical, and the anticipated power saving is nearly impossible to be realized in ordinary applications.

Succeeding refinements for saving and reusing only a fraction of the charge seem to be compatible with conventional CMOS technology. An example is a Reduced-Power Buffer (RPB), illustrated in FIG. 1B, which uses storage capacitor to save some of the charges otherwise being dissipated. This circuit includes a driver with an additional storage capacitor attached to the output node through a switch T1. During a high-to-low transition, the circuit saves some of the charge into the storage capacitor Cs, instead of dissipation to the ground. Just before the next low-to-high transition, the saved charge is recycled to the output node.

This scheme is only useful to the applications dominated by switching of large capacitive loads, and the storage capacitor must be relatively larger than the load capacitor to obtain sufficient power saving. Another example is a refresh scheme in DRAM to recycle the charge used to refresh cells in one array for use in the other array, which is described in an article entitled "A charge Recycle Refresh for Gb-Scale DRAM's in File Applications," IEEE Journal of Solid State Circuits, Vol. 29, No. 6, June 1994, by Kawahara et al.

However, there is no practical charge recycling scheme for general use in logic circuit design.

The conventional storage element, device or latch, such as a true single-phase clock (TSPC) latch, is also prone to noise and substantial leakage current. The TSPC latch has severe noise margin problem when it is used with conventional circuits. For example, an internal node may be tristated 'high' with an output node being tristated 'low' by driving a logic 'one' signal to an input electrode when the latch is opaque. Such a condition is similar to a dynamic node driving a dynamic gate that is very sensitive to noise. Thus, the noise can reduce the voltage on the internal node enough to cause a substantial leakage current through a PMOS transistor, and change the logic state at the output node. This problem and solution are addressed in an article by D. W. Dobberpuhl et al. entitled "A 200-MHz 64-b dual-issue CMOS microprocess," published in IEEE J. Solid-State Circuits, Vol. 27, No. 11, pages 1555–1564, November 1992.

DISCLOSURE OF THE INVENTION

An advantage of the present invention is in decreasing the power consumption of a logic circuit and/or a storage element.

Another advantage of the present invention is in increasing the speed of a logic circuit and/or a storage element.

A further advantage of the present invention is in reducing the di/dt noise of a logic circuit and/or a storage element.

Still another advantage of the present invention is in eliminating the noise sensitive dynamic nodes of a logic circuit and/or a storage element.

Still a further advantage of the present invention is in easily implementing any logic function.

Another advantage of the present invention is in reducing a device count for a logic circuit and/or a storage element.

The present invention is achieved at least in part by a storage device, responsive to an input signal of first, second and third signal levels and a control signal of first and third signal levels, comprising a) a first plurality of transistors; b) a first pair of transistors coupled to the first plurality of transistors and coupled to each other at a first storage node; and c) a second pair of transistors coupled to each other at the first storage node.

The present invention can be also achieved at least in part by a semiconductor device comprising a logic circuit and a latch circuit. The logic circuit includes i) first and second output nodes, ii) a pair of cross-coupled first and second transistors coupled to the first and second output nodes, iii) a third transistor coupled to the first and second transistors, the third transistor equalizing the first and second output nodes to potentials which are about equal to one another, iv) a sense amplifier to accelerate a potential pull-down transition of the first and second output nodes, and v) means for generating an enable output signal. The latch circuit includes an input electrode coupled to one of the first and second output nodes of the logic circuit, a control input electrode coupled for receiving the enable output signal, and an output electrode for providing one of an output signal and an inverted signal of the output signal.

The present invention may be achieved in part by a storage element for a semiconductor device comprising a) an input electrode for receiving an input signal of one of first, second and third signal levels; b) a control input electrode for receiving a control signal of one of first and third signal levels; c) means for maintaining a first storage node at a tristate condition when the input signal at the input electrode transits from one of (i) second signal level to first signal level and (ii) second signal level to first signal level; and d) means, coupled to the maintaining means, input electrode and control electrode, for changing the tristate condition of the first storage node to one of (i) first signal level when the input signal transits from the second signal level to the first signal level and (ii) third signal level when the input signal transits from the second signal level to the third signal level.

In accordance with the present invention, a storage element for a semiconductor device comprises a) an input electrode for receiving an input signal of one of first, second and third signal level; b) a control input electrode for receiving a control signal of one of first and third signal level; c) means for maintaining a first storage node at a tristate condition when the input signal at the input electrode transits from one of (i) second signal level to first signal level and (ii) second signal level to first signal level; and d) means, coupled to the maintaining means, input electrode and control electrode, for changing the tristate condition of the first storage node to one of (i) first signal level when the input signal transits from the second signal level to the first signal level and (ii) third signal level when the input signal transits from the second signal level to the third signal level.

The present invention can be also achieved in part by a method for storing one of first and third signal levels at first and second storage nodes, respectively, in response to an input signal of one of first, second and third signals levels and a control signal of one of first and third level, the second signal level having a magnitude in-between the first and third signal levels, the method comprising the steps of (a) maintaining a first storage node at a tristate condition when the input signal transits from one of (i) second signal level to first signal level and (ii) second signal level to first signal level; and (b) changing the tristate condition of the first storage node to one of (i) first signal level when the input signal transits from the second signal level to the first signal level and (ii) third signal level when the input signal transits from the second signal level to the third signal level.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 7B is a table illustrating the operating states of various transistors and node potentials of the SSIL illustrated in FIG. 7A during precharge and evaluation phases of the CRDL circuit;

FIG. 8C is a table illustrating the operating states of various transistors and node potentials of the SSIL illustrated in FIG. 8B during precharge and evaluation phases of the CRDL circuit.

BEST MODE FOR CARRYING OUT THE INVENTION

The choice of a logic style for implementing the logic functions depends on many criteria, such as speed, power, testability, and ease of design. To reduce power consumption, factors such as the supply voltage, parasitic capacitance, switching activity of operation, short-circuit current, and ease of applying power-down mode, etc., are major considerations. The speed is also an important consideration because power consumption is affected by the energy required to do a given operation.

Figure 1A:
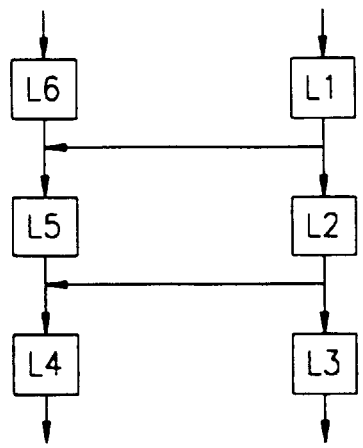
FIG. 1A illustrates the concept of the charge recovering technique.
Figure 1B:
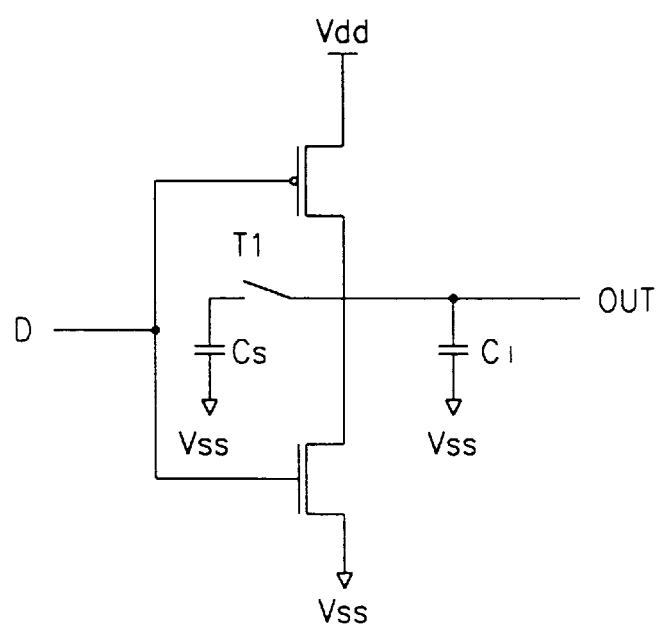
FIG. 1B is a simplified transistor-level schematic of a reduced power buffer.
Figure 2A:
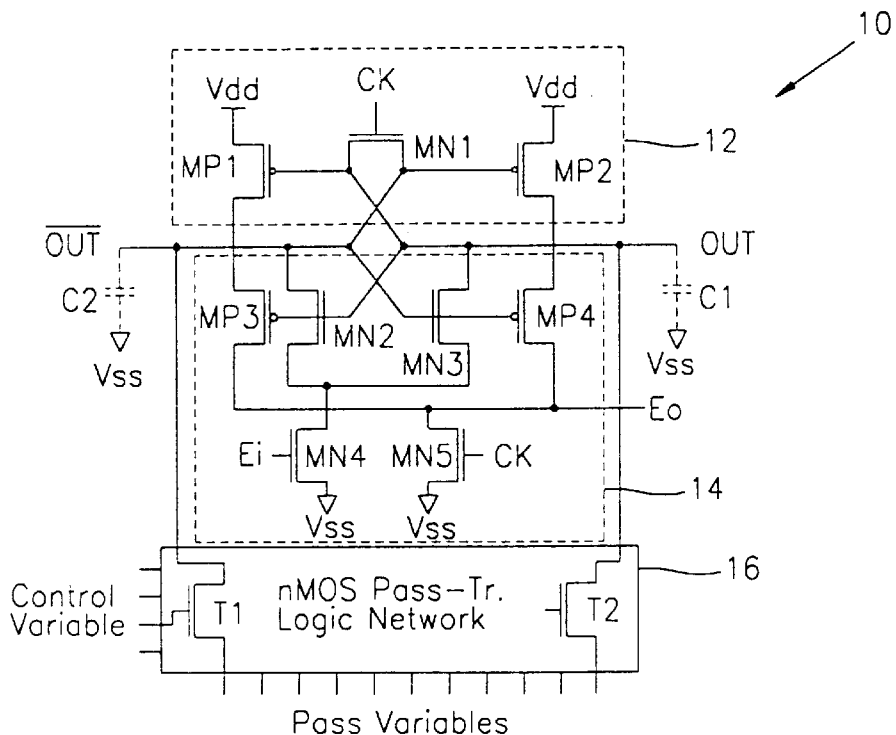
FIG. 2A is schematic of a Charge Recycling Differential Logic (CRDL) circuit in accordance with an embodiment of the present invention.

FIG. 2A illustrates a generic Charge Recycling Differential Logic (CRDL) circuit 10 in accordance with the present invention. The CRDL includes a complementary output pass-transistor logic network 16 with a precharging circuitry 12, and an acceleration buffer 14. There are generally two types of inputs to the pass-transistor logic network: (1) control variables and (2) pass variables to implement a particular logic function.

The precharging circuitry 12 includes a cross-coupled pair of the pMOS transistors MP1 and MP2 connected to the output nodes /OUT and OUT, respectively, and an nMOS transistor MN1 connected to the gates of transistors MP1 and MP2. The cross-coupled pair MP1 and MP2 pulls one of the complementary output nodes /OUT or OUT up to Vdd as the other goes down to Vss, while the nMOS transistor MN1 is used to equalize the voltages of the output nodes OUT and /OUT to about half the supply voltage Vdd. The threshold voltages of the pMOS transistors MP1 and MP2 in the cross-coupled pair are relatively higher than other transistors. In other words, the pMOS transistors MP1 and MP2 are nearly off when the two complementary output nodes OUT and /OUT are precharged to half Vdd. The capacitors C1 and C2 are parasitic capacitances of the output nodes OUT and /OUT, respectively. The parasitic capacitances may or may not be equal to each other.

The nMOS pass transistor logic network 16 operates faster than a cascode logic network. However, when used in a long chain of a buffer, the speed of the CRDL circuit 10 may be degraded. The acceleration buffer 14 may be added to increase the operational speed of the CRDL circuit 10. The acceleration buffer 14 is activated by an enable signal Ei, and the signal Eo is the output signal for use as the enable signal Ei in the next stage. The transistors MN2, MN3, and MN4 form the sense amplifier to accelerate a pull-down transition, and transistors MP3, MP4, and MN5 are used to generate the enable signal for the amplifier in the next stage. The enable signal Ei disables the transistor MN4 in the precharge phase and enables the transistor MN4 in a self-timed manner during the evaluation phase to accelerate the pull-down transitions of output nodes OUT and /OUT.

The CRDL circuit 10 has preferably two phases of operation, i.e., a precharge phase and an evaluation phase. During the precharge phase, the clock signal CK goes high, connecting the two output nodes OUT and /OUT through the nMOS transistor MN1. By the charge sharing effect, the voltage levels of both output nodes OUT and /OUT become substantially equal. Since the outputs are complementary, the output nodes OUT and /OUT reach a voltage level inbetween Vdd and Vss. Generally, the output nodes OUT and /OUT reach ½ (Vdd–Vss) if the voltage applied to the logic is source and ground voltage. Assuming that the parasitic capacitance of each node is comparable, the voltage of the output nodes reach about half Vdd. If not, the pMOS transistors in the cross-coupled pair turn on, and supply an additional charge to the precharge nodes making the voltage closer to half Vdd. After reaching the required voltage level, output nodes experience no subsequent pull-up because the cross-coupled pMOS transistors MP1 and MP2, having higher threshold voltages, turn off immediately.

In the evaluation phase, the clock signal CK goes low such that the transistor MN1 turns off to separate the precharged nodes OUT and /OUT from each other. Depending on the applied input values, a low impedance path to ground is established at one of the two precharged nodes through the pass-transistor network 16, pulling down the node toward ground. For example, if the output node /OUT is to be evaluated low, the lowering of the voltage level at this node turns on the pMOS transistor MP2 in the cross-coupled pair, pulling up the output node OUT. When the enable input signal Ei goes high, the transistor MN4 is turned on to activate the sense amplifier. Through the regenerative action of the sense amplifier, the output node /OUT is pulled down quickly toward ground. As the voltage difference between the output nodes OUT and /OUT becomes larger, the transistor MP4 in the acceleration buffer turns on to generate the output Eo, which is to be used for activating the sense amplifier in the next stage.

As described above, the acceleration buffer is used to increase the speed of the CRDL circuit, and is not necessarily required in the CRDL circuit. However, when used, the timing of the output signal Eo from the previous stage should meet certain constraints for reliable operations. For speed, a faster Ei signal is preferable to achieve a higher performance. However, if the sense amplifier is enabled too fast, the amplifier may not sense the logic states correctly, leading to false output values. Thus, the enable signal Ei should be enabled after a sufficient voltage difference between the output nodes OUT and /OUT.

For reliable operation, the output signal Eo of the previous stage is preferably used as the enable signal Ei for the current stage. The enable signal Ei for the current stage can be applied from the 2nd or 3rd previous stages, instead of the 1st previous stage to achieve the highest possible speed, assuming no timing constraint is violated. If the output signal Eo from the previous stage cannot meet certain timing constraints, the propagation delay can be adjusted by changing the size of the transistors in the acceleration buffer 14, by inserting a proper delay element, etc.

Figure 2B:
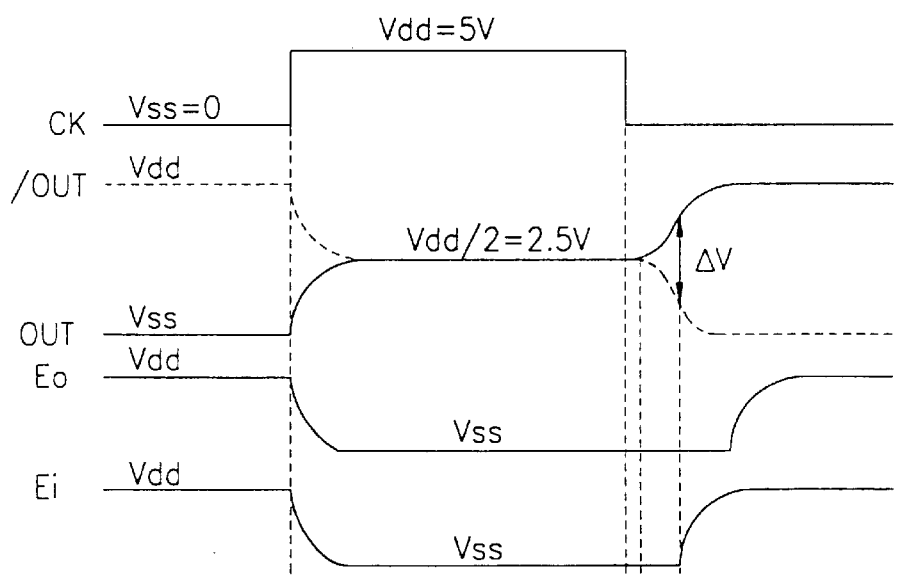
FIG. 2B is an operational timing diagram of the CRDL circuit illustrated in FIG. 4A.

With reference to FIG. 2B, the operation of the CRDL circuit 10 of FIG. 2A is as follows, assuming Vdd is about 5V and the nMOS pass transistor logic network 16 comprises nMOS transistors T1 and T2, where the gate and drain of each transistor is coupled to the control variables and pass variables, respectively. The control and pass variables may be connected to the output nodes of a previous stage.

When the clock signal CK is low, the CRDL circuit is in an evaluation phase. During this phase, the transistor MN1 is off, and the output nodes OUT and /OUT are separated from each other. The potential of OUT and /OUT are 0V (e.g., low) and 5V (e.g., high), respectively. The enable signal Ei and the output signal Eo are both at about 5V or high.

When the clock signal CK changes to a low signal, the CRDL circuit 10 operates in a precharge phase. The transistor MN1 is turned on, and the output nodes OUT and /OUT are connected to each other. Hence, the charge stored in the parasitic capacitor C2 of the output node /OUT is shared with the parasitic capacitor C1 of the output node OUT until the potential at each node reaches about half Vdd, i.e., 2.5V. During the precharge phase, the transistors MP3, MN2, MN3, MP4, MN4 and MN5 are all off, and the enable signal Ei and the output signal Eo drop to 0V or low.

When the clock signal changes to a low signal, the voltage applied to the gate and drain of the transistor T1 increases to 5V and decreases to 0V, respectively, while the voltage applied to the gate and drain of the transistor T2 decreases to 0V and increases to 5V, respectively. Hence, the transistors T1 and T2 are turned on and off, respectively. Since current flows through the transistor T1, the potential at the output node /OUT goes down to 0V, causing transistor MP2 to be turned on. A current flow through the transistor MP2 increases the potential at the output node OUT to 5V or high.

As shown, the pull down of the output node /OUT is faster than the pull up of the output node OUT. For reliable operation, the enable signal Ei should be applied when there is a certain voltage deviation ΔV between the output nodes OUT and /OUT. When the enable signal Ei of 5V is applied, the transistor MN4 is turned on. The transistor MN5 is turned off due to a clock signal of a low level. Since the gates of transistors MP3 and MN2 are coupled to the output node OUT, the transistors MP3 and MN2 are turned off and on, respectively. Similarly, since the potential at the output node /OUT decreases to 0V, the transistors MN3 and MP4 are turned off and on, respectively. As a result, the pull down operation is accelerated, and the output signal Eo of high is generated. As shown in FIG. 2B, there is a timing difference between the enable signal Eo and the output signal Eo.

As illustrated above, the transistor MN1 functions as an equalization transistor to allow the sharing of charges between the parasitic capacitances of the output nodes OUT and /OUT. The cross-coupled pair of transistors MP1 and MP2 allows precise precharge level of about ½ (Vdd−Vt), where Vt is the threshold voltage of the transistors MP1 and MP2, during the precharge phase. During the evaluation phase, the transistors MP1 and MP2 supply current for a pull-up function. The pull-down function is accomplished by the nMOS pass transistor logic network 16.

As discussed above, the threshold voltages of transistors MP1 and MP2 are relatively higher than the other transistors. To adjust the threshold voltage, an extra implantation process can be carried out. However, such an additional process step may be too costly. As known to one of ordinary skill in the art, back bias or other techniques can be used to control the threshold voltage of the transistors MP1 and MP2 to be higher than the precharge level at the output nodes OUT and /OUT.

Figure 2C:
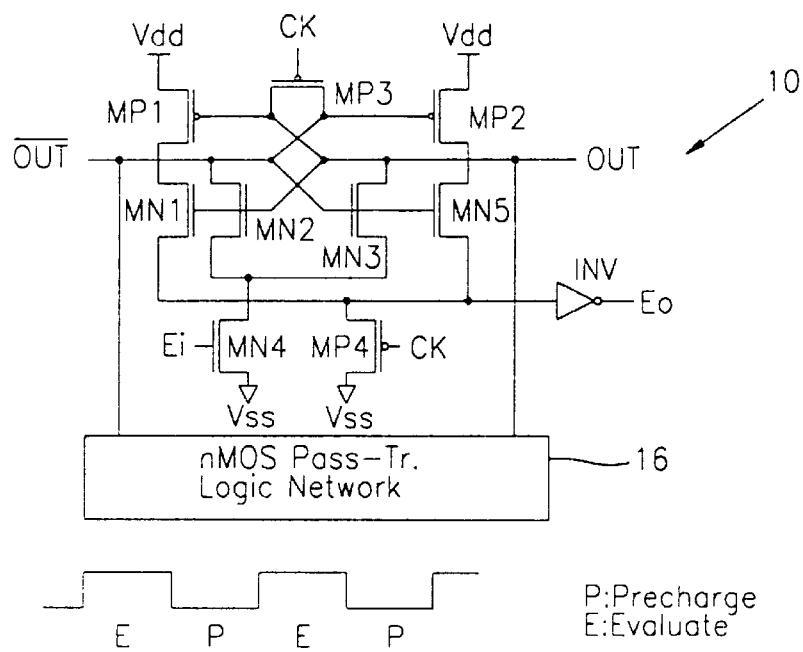
FIGS. 2C–2E are schematics of different embodiments of the CRDL circuit.
Figure 2D:
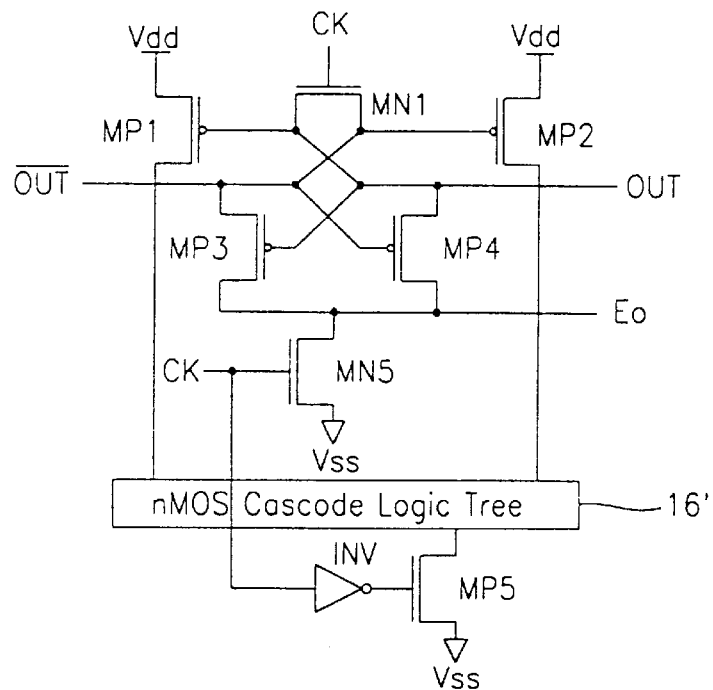
Figure 2E:
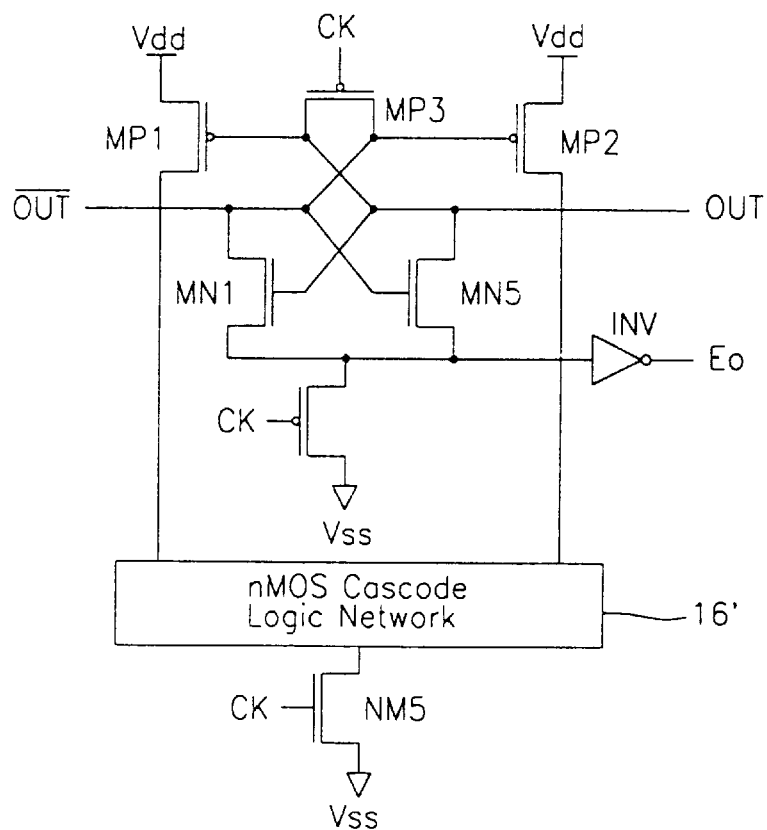

FIGS. 2C–2E illustrate different embodiments of the CRDL circuit. In the FIG. 2C embodiment, the transistors MN1, MP3, MP4 and MN5 of the FIG. 2A embodiment are replaced by the transistors MP3, MN1, MN5 and MP4, respectively, such that the CRDL circuit 10 operates in the precharge and evaluation phases when the clock signal is at low and high levels, respectively. The FIGS. 2D and 2E embodiments are similar to the FIGS. 2A and 2C embodiments. Instead of using an nMOS pass transistor logic network 16, the CRDL circuit of FIG. 2D uses an nMOS cascode logic networks 16'. Since there is no speed degradation in a cascode logic tree, the transistors MN2, MN3 and MN4 of FIG. 2A embodiment are eliminated, and an inverter INV and a transistor MP5 are added in the FIG. 2D embodiment.

Similarly, the CRDL circuit of FIG. 2E uses an nMOS cascode logic tree 16' and the transistors MN2, MN3 and MN4 of FIG. 2C are eliminated and an inverter INV and a transistor MN5 are added in the FIG. 2E embodiment. The transistors MP5 and MN5 of the FIGS. 2D and 2E embodiments prevent a leakage current of the nMOS cascode logic network. Based on the operational description of the FIG. 2A embodiment, the operation of the FIGS. 2C–2E is apparent to one of ordinary skill in the art, and the description thereof is omitted for simplicity.

As described above, the potential at the output nodes OUT and /OUT goes from Vdd to ½ (Vdd) to Vss or vice versa. Unlike the present invention, most conventional CMOS circuits require full voltage swing from Vdd to Vss or vice versa. Hence, the output nodes OUT and OUT require an interface to change the voltage swing level for use with conventional full swing logic circuits.

The CRDL circuit has several important advantages over conventional dynamic logic circuits. The CRDL circuit uses a novel precharge scheme in which the charge used for the logic evaluation in a first cycle is recycled to establish a precharge value in the second subsequent cycle. Hence, the CRDL consumes less power than the conventional full-swing precharge circuits. In ideal situations, assuming that precise half-supply precharge level is achieved, the amount of power consumed by the CRDL circuit is about 50% less than a full-swing circuit.

The charge recycling operation also reduces di/dt noise on the supply lines, which sometimes a critical problem in conventional circuits. The CRDL circuit uses internally stored charge to precharge the output nodes during the precharge phase, resulting in a reduction in the amount of the current from the supply. Noise during the evaluation phase also decreases due to reduced voltage swing, resulting in smaller current to and from the supply lines.

Further, there is no noise-sensitive dynamic nodes in the gates. Although the operation of the CRDL circuit is based on the precharge and evaluation actions using a clock, all of the evaluated nodes are connected to either supply or ground rails leading to a static operation. Hence, the problems related to a dynamic node, such as degraded noise margin, are eliminated.

The CRDL circuit also has the advantages of the pass-transistor logic network to implement any random Boolean function. For example, XOR's can be implemented using only two pass-transistors. In the CRDL circuit, the devices needed for the pull-up function in the pass-transistor network can be eliminated since the cross-coupled transistors in the precharge circuitry perform such a function. Such an efficient implementation is particularly important since the key to reducing power dissipation and increasing speed of logic circuits is the reduction of the number of devices.

Figure 3A:
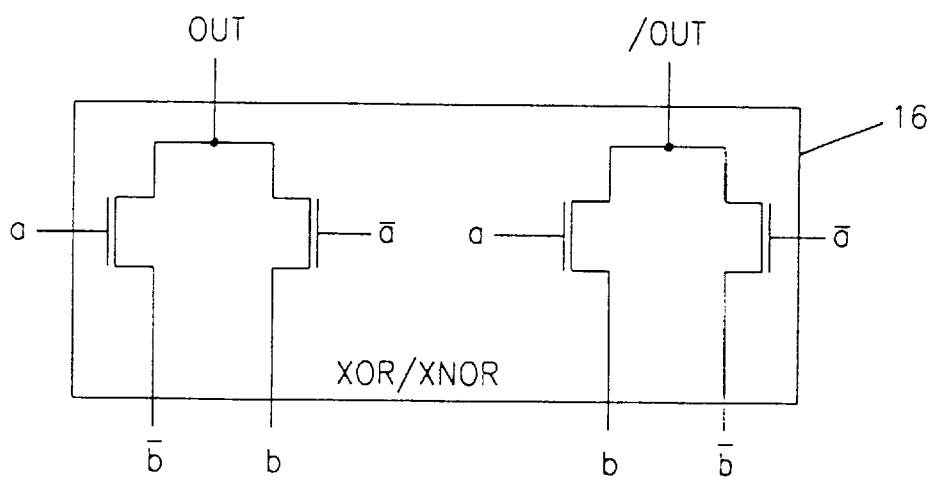
FIGS. 3A and 3B illustrate the pass transistor logic network for implementing the XOR/XNOR logic function and the logic table, respectively.
Figures 3B, 3C, 3D:
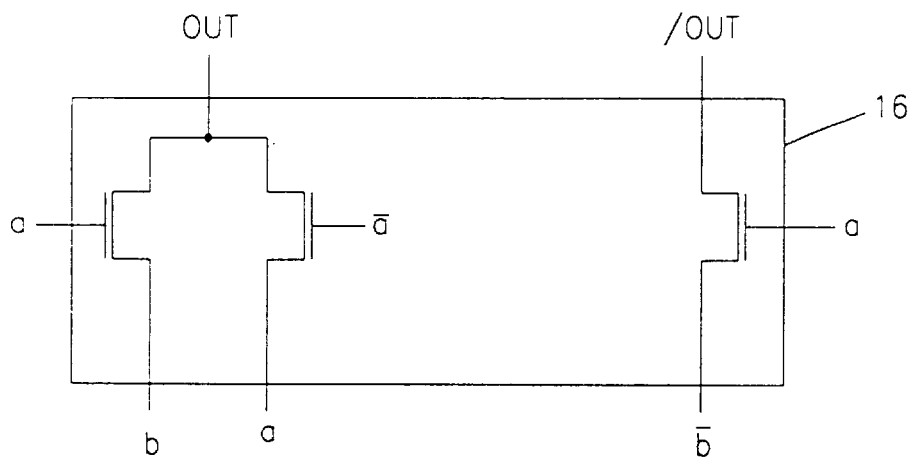
FIG. 3C and 3D illustrate the pass transistor logic network for implementing the AND/NAND logic function and the logic table, respectively.

FIGS. 3A and 3C illustrate the nMOS pass transistor logic network to implement the Boolean function of XOR/XNOR and AND/NAND gates. As shown in the logic table of FIG. 3B, the XOR function is accomplished by two pass transistors coupled to the output node OUT, and the XNOR function is accomplished by two pass transistors coupled to the output node /OUT. Similarly, as shown in the logic table of FIG. 3D, the AND function is accomplished by two pass transistors coupled to the output node OUT, and the NAND is accomplished by a pass transistor coupled to the output node /OUT.

Figure 4A:
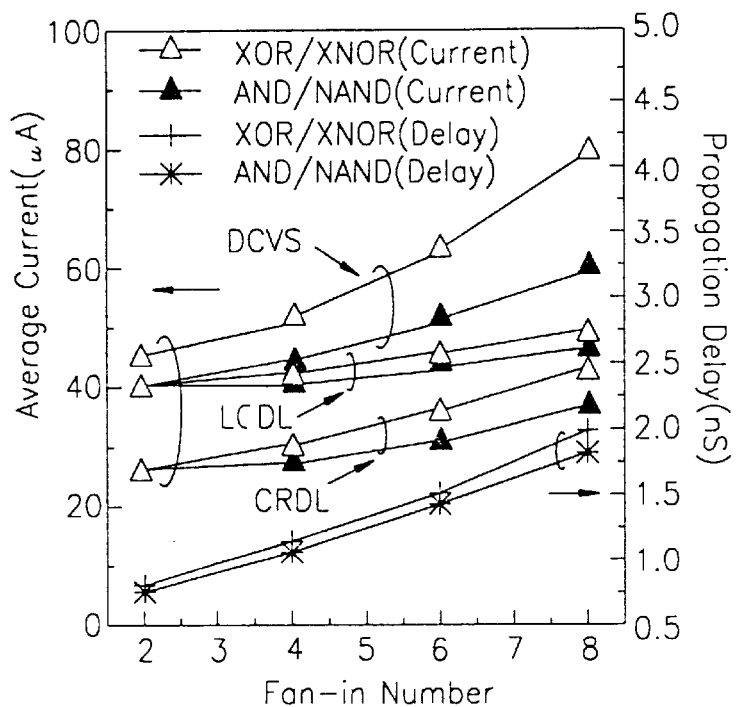
FIG. 4A illustrates comparison results of current consumption for XOR/XNOR and AND/NAND gates using DCVS, LCDL and CRDL circuits.
Figure 4B:
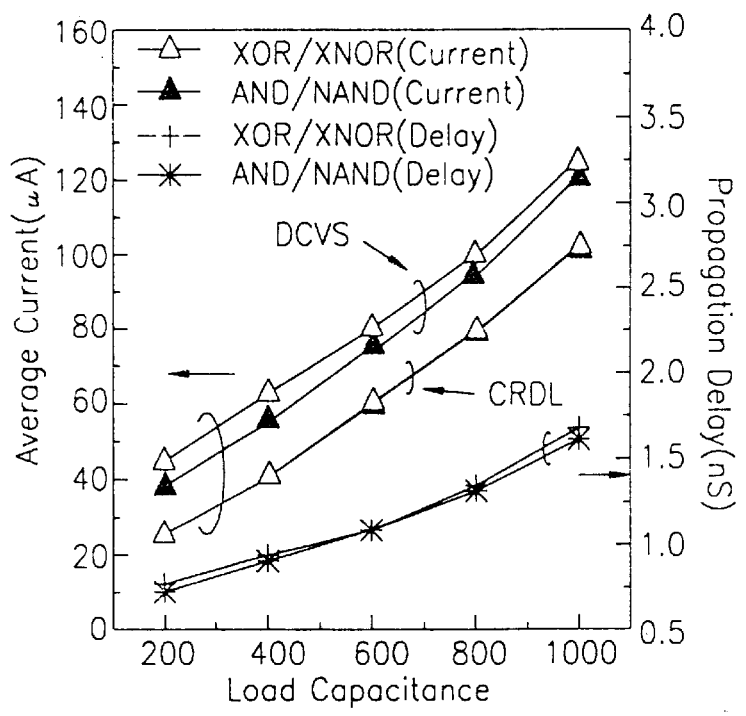
FIG. 4B illustrates current consumption of two input XOR/XNOR and AND/NAND gates using DCVS and CRDL circuits with changing load capacitance.

To verify the performance of the CRDL circuit, the current drawn from the supply rail is compared with those of the conventional logic types, such as DCVS and LCDL. The comparisons were done at a power supply of 5V using HSPICE for several fan-in numbers and load capacitance values. FIG. 4A plots the current consumption of the XOR/XNOR and the AND/NAND gates implemented in each logic circuit with the fan-in number being changed from 2 to 8 at a load capacitance of 100fF. FIG. 4B shows the same data with the load capacitance is changed over the range of 0.2~1pF.

The propagation delays of all the logic styles for each Boolean function are made to be the same by device sizing for each fan-in number and load capacitance value, and are shown in the respective figure. From these figures, the CRDL circuit has the smallest current consumption among all the logic circuits, indicating that this logic type consumes the least amount of power.

As described above, a novel logic circuit, called a CRDL circuit, and the devices using the same are disclosed above to meet the demands of current low-power high-speed VLSI systems. The CRDL circuit improves power efficiency by utilizing a charge recycling technique with comparable speed of the conventional precharged circuit. Due to inherently static operation, the noise margin is improved and the problems related to dynamic nodes are eliminated. Further, the CRDL circuit has less ground bouncing noise since the CRDL circuit recycles the internal charge. Moreover, the CRDL circuit has a smaller voltage swing as compared with the conventional precharge logic circuits.

Figures 5A, 5B:
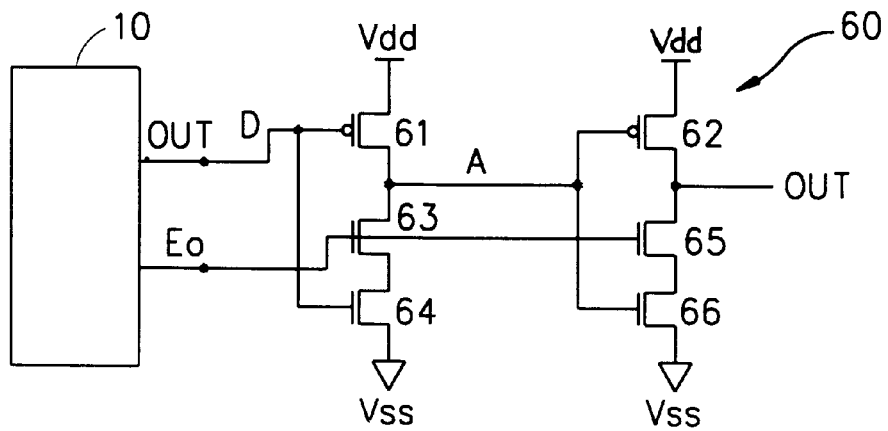
FIG. 5A is a schematic of a true single-phase-clock (TSPC) latch configured to be coupled to a CRDL circuit.
FIG. 5B is a table illustrating the operating states of devices and node potentials of a true single-phase-clock (TSPC) latch, in accordance with the present invention during precharge and evaluation phases.

The true single-phase-clock (TSPC) latch 60 can be used as a storage element for storing output data of a CRDL circuit applied at the input electrode D, as shown in FIG. 5A. The output signal of the acceleration buffer, Eo, is used as the control signal, instead of the clock signal in a conventional TSPC latch. When the TSPC latch 60 is driven by the output of a CRDL circuit, a first node A does not exhibit the noise-sensitive behavior.

For example, when the input signal at the input electrode D transits from Vss to ½ (Vdd–Vss), e.g., ½ Vdd if Vss is a ground voltage, the latch enters the opaque state in response to an enable signal Eo of a low level, e.g., the precharge phase of the CRDL circuit. See columns 1 and 2 of FIG. 5B, illustrating the operation of the TSPC latch. The precharge potential of ½ (Vdd–Vss) is low enough to turn on a transistor 61, resulting in the first node A being held at Vdd, instead of being tristated. The transistor 62 is in cutoff state preserving its output state during this period. Hence, no such noise margin problem occurs when a TSPC latch 60 is used with CRDL.

Figure 6A:
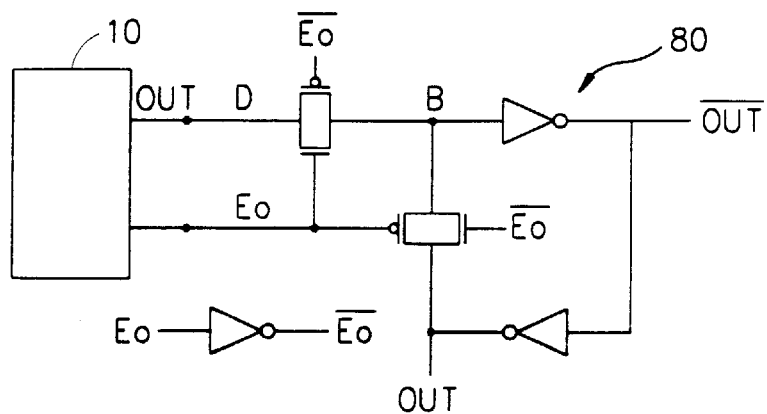
FIG. 6A is a schematic of a transmission gate latch configured for connection with a CRDL circuit.
Figure 6B:
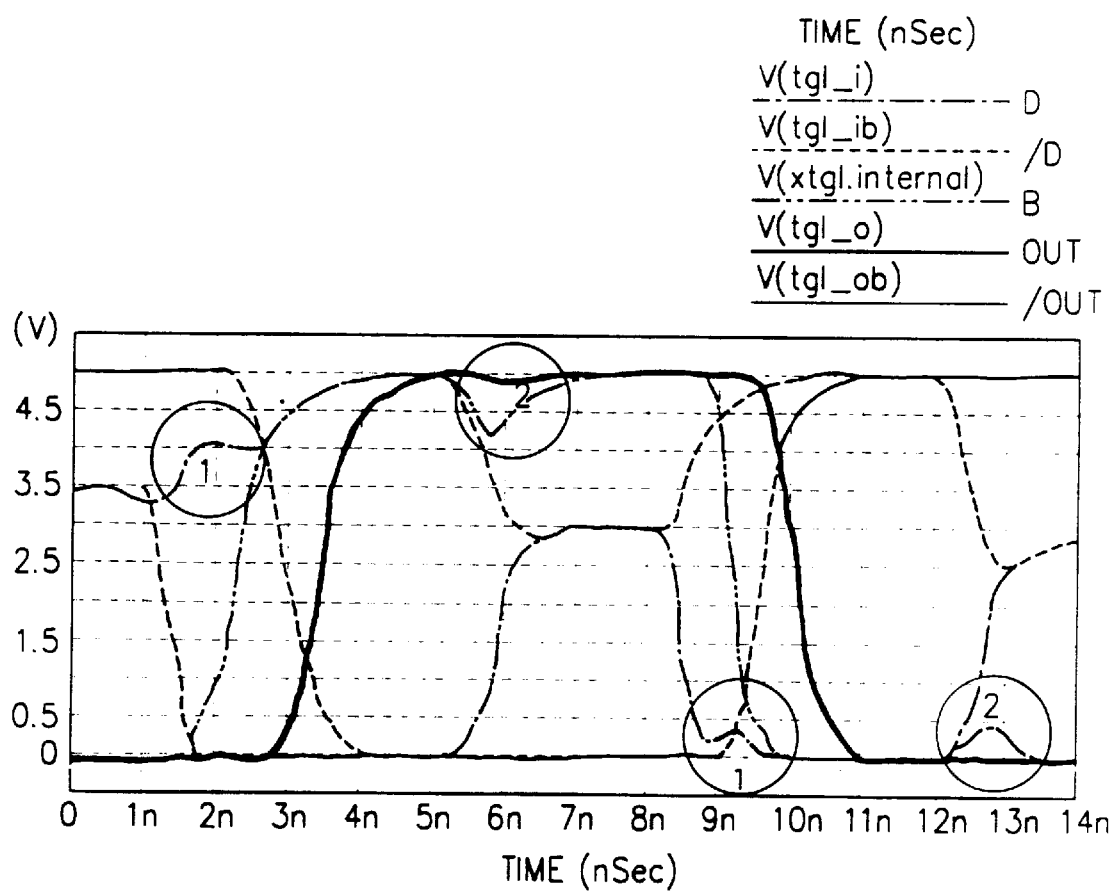
FIG. 6B illustrates signal waveforms present at input electrodes, nodes and output electrodes of a transmission gate latch of FIG. 6A during precharge and evaluation phases of a CRDL circuit.

When a static latch is desired, a conventional transmission gate latch 80 may be used with the clock being replaced by the buffer output signal Eo of a CRDL circuit, as shown in FIG. 6A. With this configuration, however, the transition of the input signal during the evaluation phase is disturbed by the internal logic state at node B resulting in slower speed, if the input logic state at the input electrode D is opposite from the logic state of the node B (see area 1 encircled in FIG. 6B). The internal logic value is also disturbed by the input signal level at the front stage of the precharge phase when the enable signal Eo is still changing (see area 2 encircled in FIG. 6B). These signal disturbances originated from the fact that the current for charging and discharging the internal node B is supplied and extracted through the input electrode D via a transmission gate. A skew inevitably occurring between the inverting and non-inverting control signals can cause a signal fighting between the old and the new values at the internal node B during the overlap period resulting in a substantial short-circuit current.

Figure 7A:
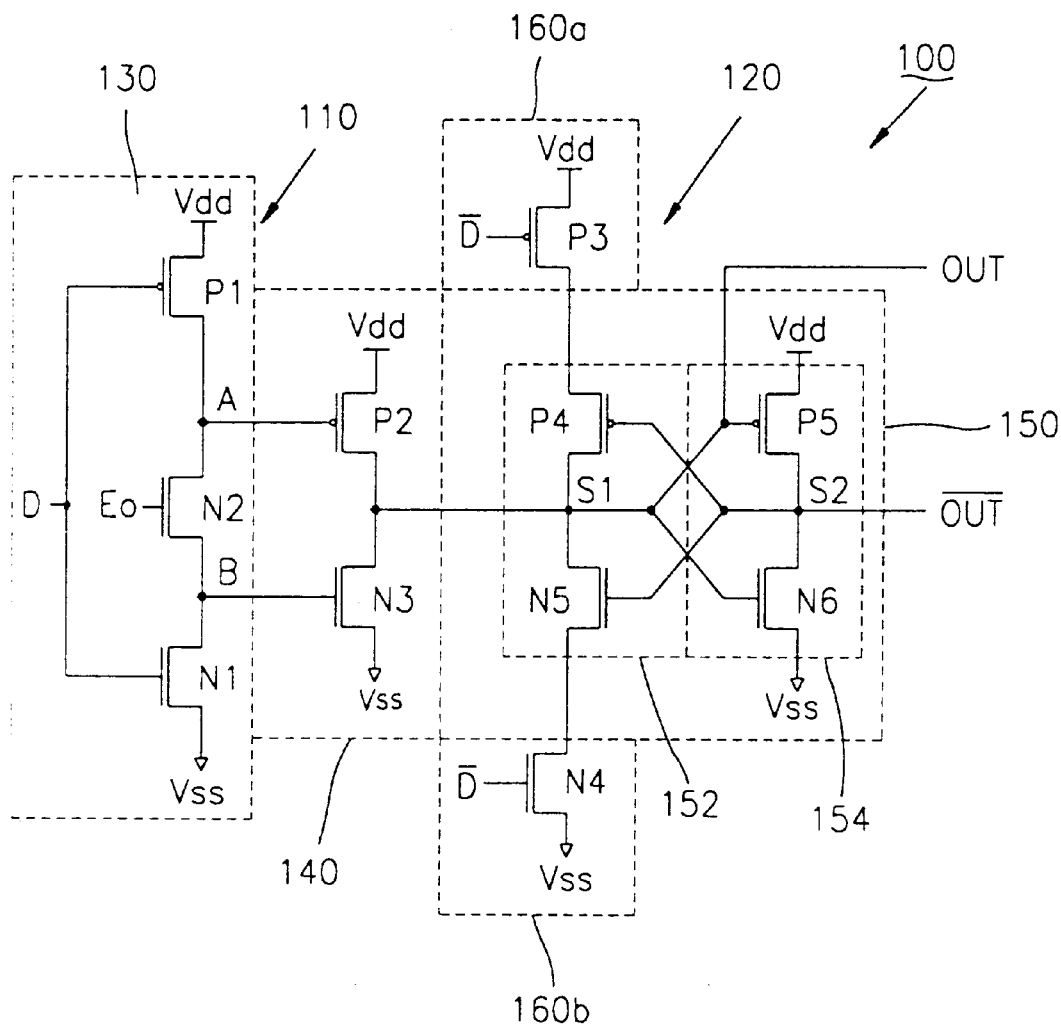
FIG. 7A is a schematic of a single-rail version of a Swing-Suppressed-Input Latch (SSIL) in accordance with the present invention.

FIG. 7A illustrates a single-rail version of a Swing-Suppressed-Input Latch (SSIL) 100 in accordance with the preferred embodiment of the present invention. The input electrodes D and /D of the SSIL 100 are coupled to receive the output signals of the above-described CRDL circuits in accordance with the present invention. The SSIL 100 includes first and second circuits 110 and 120. The first circuit 110 changes a signal/logic level of first and second output nodes OUT and /OUT, respectively, during the evaluation phase of the CRDL circuit. The second circuit 120 maintains the signal/logic level at first and second output electrodes OUT and /OUT during the precharge phase of the CRDL circuit.

The first circuit 110 includes a first plurality of transistors 130 and a first pair of transistors 140. The control input electrode Eo is coupled to receive the enable signal outputted from the CRDL circuit. The first plurality of transistors 130 are connected to the first pair of transistors 140 at first and second nodes A and B.

The second circuit 120 comprises a cross-coupled inverter 150 and a second plurality of transistors 160a and 160b. The cross-coupled inverter 150 comprises a second pair of transistors 152 and a third pair of transistors 154. The second pair of transistors is connected to the first pair of transistors 140 at a first storage node S1 and is connected to the third pair of transistors 154 at a second storage node S2. The second pair of transistors 152 is also connected between the second plurality of transistors 160a and 160b. The third pair of transistors 154 is also coupled to the second pair of transistors 152 at the first storage node S1. The first and second output node OUT and /OUT are coupled to the first and second storage nodes S1 and S2, respectively.

FIG. 7A illustrates specific types of transistors for the SSIL 100, e.g., PMOS and NMOS transistors. Further, the first and second electrodes, e.g., source and drain, of the transistors are coupled to source voltage of Vdd, and a ground voltage of Vss, e.g., 5V and 0V, respectively. Further, the signal/logic levels may be high (logic 'one') and low (logic 'zero'). As can be appreciated by one of ordinary skill in the art, different channel type transistor, different switching device types, different source voltage, and/or different signal/logic levels may be used to achieve the present invention without departing from the spirit and scope of the claimed invention. The circuit schematic of the SSIL is described when coupled to the embodiment of the CRDL illustrated, for example, in FIG. 2A, but the SSIL can be readily modified by one of ordinary skill in the art to accommodate other modifications or embodiments of the CRDL circuit.

The first plurality of transistors 130 includes first, second and third field effect transistors P1, N2 and Ni which are coupled in series between voltages Vdd and Vss. The gates of transistors P1 and Ni are commonly connected to the input electrode D, and the drain and source of transistor N2 is connected to a drain of transistor P1 and a drain of transistor Ni at first and second nodes A and B, respectively. The first pair of transistors 140 comprises fourth and fifth field effect transistors P2 and N3 connected in series between the voltage sources Vdd and Vss. The gates of transistors P2 and N3 are connected to first and second nodes A and B, respectively, and the drain of transistor P2 and drain of transistor N3 are connected to the first storage node S1. The first output node OUT is connected to the first storage node S1.

The second pair of transistors 152 of the cross-coupled includes sixth and seventh field effect transistors P4 and N5 connected in series at the first storage node S1. The gates of the transistors P4 and N5 are connected to the second storage node S2. The third pair of transistors includes eighth and ninth field effect transistors P5 and N6 connected in series between source voltages Vdd and Vss at the second storage node S2. The gates of transistors P5 and N6 are connected to the first storage node S1. The second output node is connected to the second output node /OUT.

The second plurality of transistors 160a and 160b comprises tenth and eleventh field effect transistors P3 and N4. The drain of transistor P3 is connected to the source of the transistor P4 and the drain of transistor N4 is connected to the drain of the transistor N5. The gates of transistors P3 and N4 are connected to the input electrode /D.

The operating states of the first transistor P1 to the eleventh transistor N4 and node potentials of the SSIL 100 during precharge and evaluation phases of the CRDL circuit are illustrated in FIG. 7B. As shown, the SSIL 100 is in opaque state while the enable signal Eo is low, turning off the transistor N2. During this phase, the first and second nodes A and B are in 'high' and 'low' states or levels, respectively, because the input signal applied to the input node D, which equals the precharged voltage, e.g. ½ Vdd (i.e., ½ (Vdd–Vss), assuming the Vss equals about zero volts), turns both transistors P1 and N1 on. Due to the 'high' and 'low' levels at the gates of transistors P2 and N3, the first pair of transistors 140 are turned off, which tristates the first output node OUT.

The transistors P3 and N4 are turned on in response to the inverted input signal at the second input electrode /D, which is also precharged to half-Vdd. Both the first and second output nodes OUT and /OUT (inverting and non-inverting outputs) are connected to each other through a cross-connected inverter to preserve their prior states, i.e.,the first and second output nodes OUT and /OUT are tristated. In other words, the first and second storage nodes S1 and S2 maintain the prior logic states or potential levels during the transition of the CRDL circuit from the evaluation phase to the precharge phase, as depicted in rows 2–3 and 4–5 of FIG. 7B.

When the input signal changes from Vss to ½ Vdd of the precharge phase, the transistors P2 and N3 are turned off, and the first storage node S1 is cut off. The first storage node S1 maintains the prior state of 'low' or 'zero', e.g., low potential level, and as a result, the transistors P5 and N6 are turned on and off, respectively. Because the transistor P5 is on, the output signal at the second output node /OUT maintains the prior 'high' state. The 'high' state of the second output node /OUT keeps the transistor P4 and N5 off and on, respectively. Due to the 'on' state of transistors N5 and N4, a conductive path is established from the first storage node S1 to the source voltage Vss, and the first storage node S1 maintains the prior logic state of 'zero'.

When the input signal changes from Vdd to ½ Vdd of the precharge phase, the transistors P2 and N3 are turned off, and the first storage node S1 is cut off. The first storage node S1 maintains the logic state of 'high' or 'one', e.g., a high potential level, of the previous state and as a result, the transistors P5 and N6 are turned off and on, respectively. Because the transistor N6 is on, the output signal at the second output node /OUT maintains the prior 'low' state. The 'low' state of the second output node /OUT keeps the transistor P4 and N5 on and off, respectively. Due to the 'on' state of transistors P3 and P4, a conductive path is established from the first storage node S1 to the source voltage Vdd, and the first storage node S1 maintains the prior logic state of 'one'. When the first and second inputs D and /D become stable and Eo becomes high during the evaluation phase of the CRDL to turn on the transistor N2, a new value can be evaluated at the first and second storage nodes S1 and S2 without any signal fighting against the old value. For example, when the output signals at the first and second storage nodes S1 and S2 are low and high, e.g., logic state 'zero' and 'one' state, respectively, the transistors N5 and P5 are turned on, as shown in row 3 of FIG. 7B during the precharge phase of the CRDL circuit. When a new input value 'one' or high logic level, e.g., Vdd potential level, is applied to the input electrode D during the evaluation phase of the CRDL circuit, the enable output signal of a high level enables the transistor N2 and the transistors P1 and Ni are turned off and on, as shown in row 4 of FIG. 7B.

Because the first and second nodes are conductively connected to the voltage Vss, the potential level at the first storage node drops to a low potential level, turning on and off the transistors P2 and N3, respectively. The on state of transistor P2 raises the potential level of the first storage level to 'high', and the logic state of the first output node OUT changes to 'one'. The high potential level of the first storage node S1 turns the transistors P5 and N6 off and on, respectively. The second storage node S2 is connected to the voltage Vss, and changes to a low logic state. The low logic state, e.g., low potential level, turns the transistors P4 and N5 on and off, respectively. Because the transistors P3 and N4 are on and off, respectively, due to the invert input signal at the input electrode /D, the first storage node S1 is connected to the voltage Vdd to preserve the logic state of the first storage node.

The operation for storing the 'zero' and 'one' states into the first and second storage nodes S1 and S2, respectively, is similar, as shown in rows 2 and 5, when the input signal transits from ½ Vdd to Vss. However, it should be noted that the high level at the second node B is one threshold voltage less than the supply level (Vdd−$V_{thN2}$), because the high potential level is transmitted through the transistor N2. Such a situation may create imbalances in the rise and the fall times of the output node. To prevent such imbalances, the width of the transistor N3 may be increased up to the level of the transistor P2 to obtain balanced transition times.

Figure 8A:
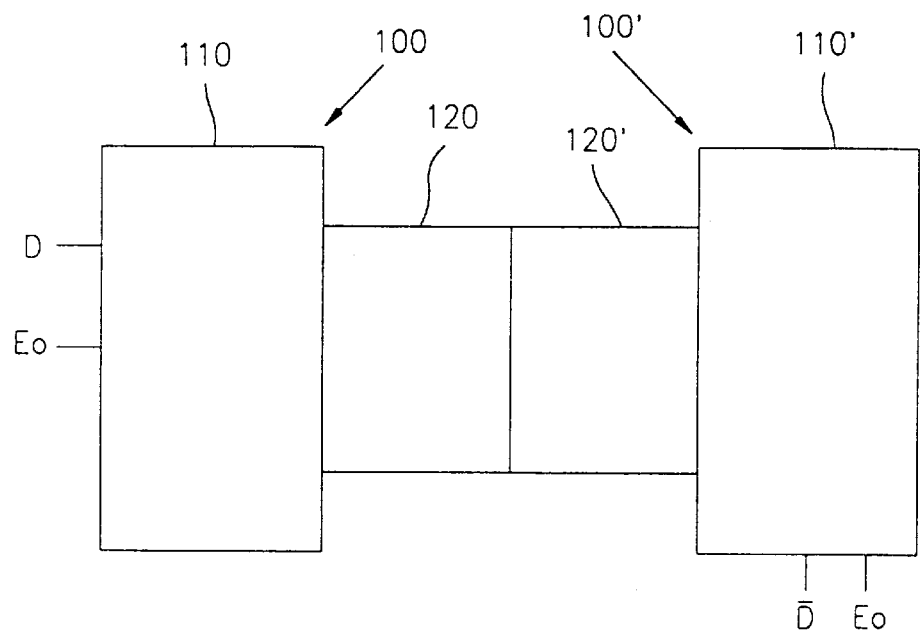
FIG. 8A is a block diagram illustrating the concept for designing a dual-rail version of a SSIL.
Figure 8B:
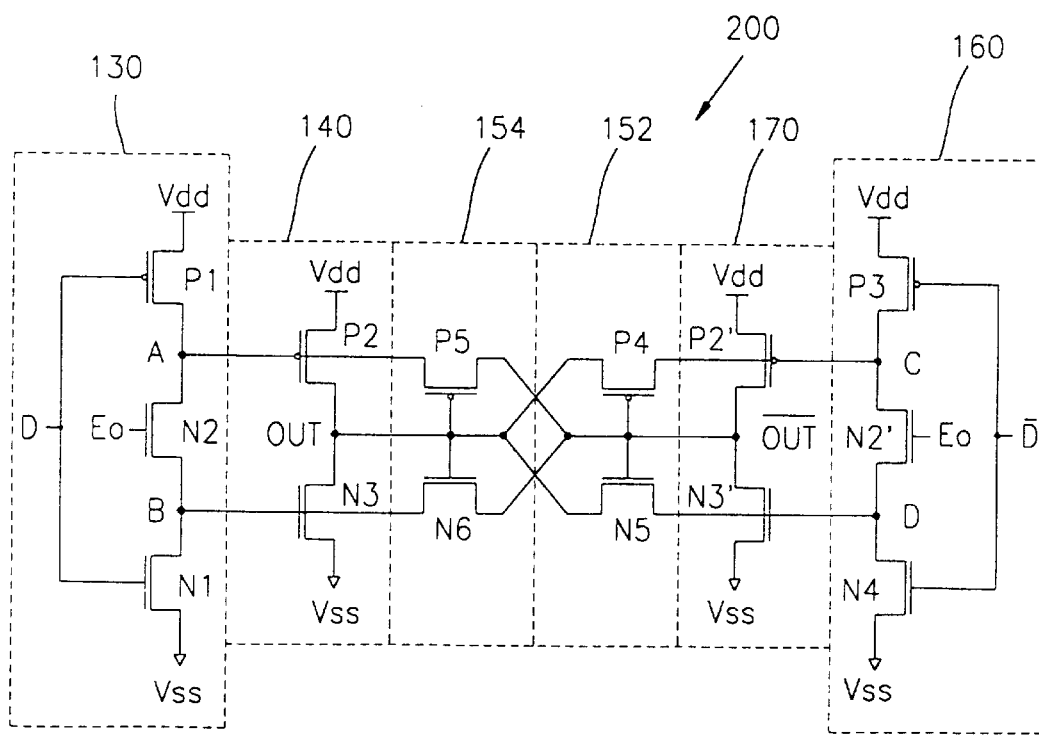
FIG. 8B is a schematic of the dual-rail version of the SSIL in accordance with the present invention.

A dual-rail version of the SSIL can be obtained by using two single-rail versions of the SSIL 100 and 100', as shown in FIG. 8A. However, due to the novel design of the present invention, many of the redundant transistors can be eliminated, resulting in a device illustrated in FIG. 8B. Instead of a total of twenty-two transistors, the dual-rail version of the SSIL 200 includes fourteen transistors.

In comparison to the single-rail version of the SSIL 100, the dual-rail version further includes 1) a twelfth field effect transistor N2' coupled between the tenth and eleventh transistors P3 and N4 of the second plurality of transistors 160 at third and fourth nodes C and D; and 2) a fourth pair of transistors 170 comprising thirteenth and fourteenth field effect transistors P2' and N3'. Further, the gate of the transistor P2 is connected to both the first node A and the source of the transistor P5 while the gate of the transistor N3 is connected to both the second node B and the drain of the transistor N6. Similarly, the gate of the transistor P2' is connected to both the third node C and the source of the transistor P4 while the gate of the transistor N3' is connected to both the fourth node D and the drain of the transistor N5.

The operation is similar to the single-rail version, and a detailed description is omitted for simplicity, because one of ordinary skill in the art can comprehend the operation based on the table illustrated in FIG. 8C. The dual-rail version 200 of SSIL improves the speed further by evaluating both the complementary outputs simultaneously. The single-rail and the dual-rail versions have no inverted control signal /Eo, compared to the conventional transmission gate latch. Hence, no skew problem occurs during transitions. Further, the SSIL's 100 and 200 have no signal disturbances because the current for charging and discharging the first and second storage nodes does not come from the input node but from the supply rails, Vss and Vdd. Although the SSIL's 100 and 200 require complementary input signals at the input electrodes D and /D, they are obtained simultaneously at no cost as the CRDL circuit generates complementary signals as its outputs.

Figure 9A:
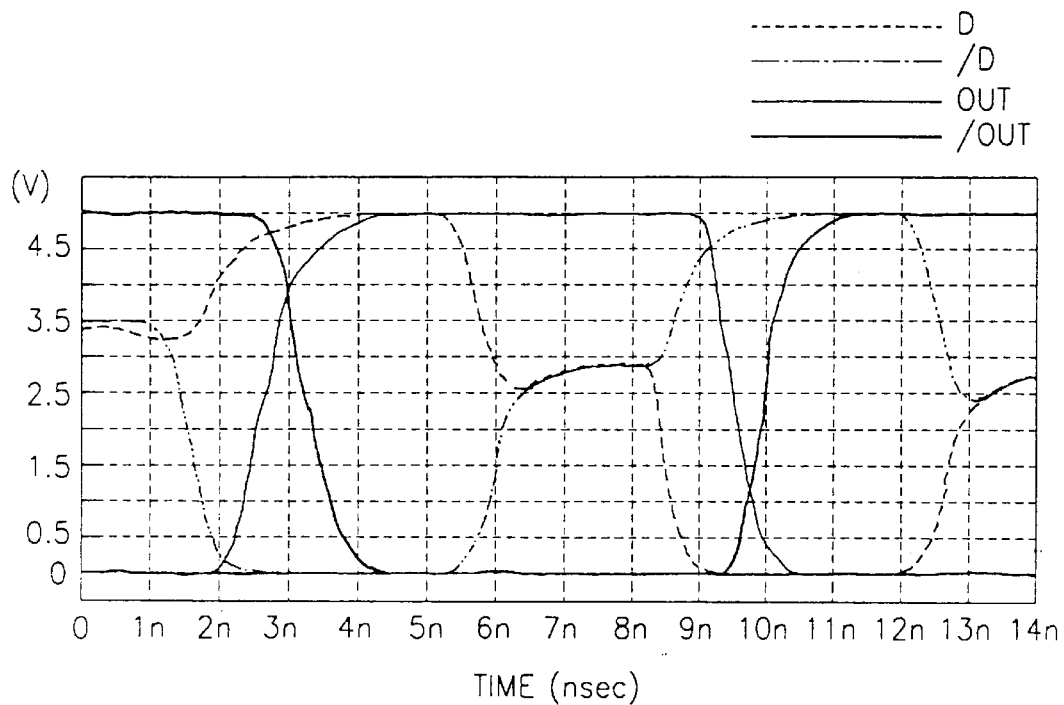
FIGS. 9A and 9B illustrate signal waveforms present at input electrodes, nodes and output electrodes of a SSIL illustrated, respectively, in FIGS. 7A and 8B during precharge and evaluation phases of a CRDL circuit.
Figure 9B:
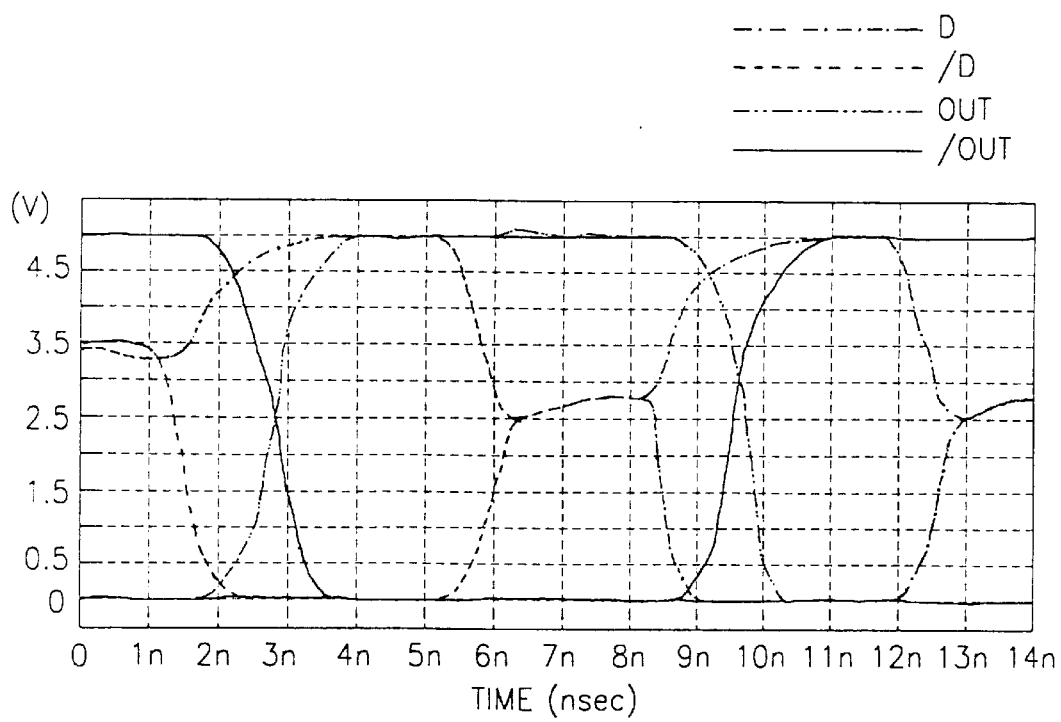

Table 1 below summarizes the comparison results of the conventional transmission gate latch 80, and single-rail and dual-rail versions 100 and 200 of the SSIL. Simulated waveforms are also shown in FIGS. 9A and 9B. The operating frequencies, e.g., maximum frequencies, are measured with 100fF load at each output node, and the powers are those consumed by latches without including output loads when the circuits are operated at the frequency of 100 MHz. The single-rail and the dual rail versions 100 and 200 show no signal disturbances at all, as shown in the waveforms of FIGS. 9A and 9B. Table I indicates that the single-rail SSIL 100 has 25% higher operating frequency with 38% less power, and the operation speed of dual-rail SSIL 200 is almost 2 times faster with slightly less power as compared with the conventional latch shown in FIG. 6.

TABLE I

Comparison results between conventional and novel latches.

| | Device Count | Equivalent Clock Load | Max. Operating Freq. (MHz) | Average Power ($\mu$W) |
|---|---|---|---|---|
| Conv. Latch | 10 | 15.25*Cg | 600 | 378 |
| Single-rail SSIL | 11 | 3.75*Cg | 794 | 234 |
| Dual-rail SSIL | 14 | 7.50*Cg | 1110 | 347 |

The speed advantage of SSIL's may be readily explained through the examination of the transition operations while new data or new logic states are being transferred into the first and second storage nodes S1 and S2. As previously discussed, when the enable output signal of a low level is applied at the control input electrode Eo, the first and second nodes A and B of FIG. 7A have 'high' and 'low' states, respectively. During the data transfer, only one of the first and second nodes has a transition depending on the input, because the other has already reached the appropriate logic level. If the logic 'high' is to be stored into the first storage node S1, the first node A needs to be discharged, while the second node B is only required to be pulled high in case of a 'low' input data. Such an operation reduces the amount of charge needed to flow through transistors N1 and P1, resulting in a decreased transition time. Moreover, there is no direct current through the transistors P2 and N3 during transition operations, because one device is always off while the other is in an active state. Such an operation of the transistors further increases the speed since all the charge supplied is used for charging the load capacitance without being wasted as a cross-over current.

Another reason for higher speed may be due to the SSIL's 100 and 200 have less number of transistors in series from the internal storage node to the supply or the ground rails. In the conventional latch, the internal node is connected to the ground through three or more transistors in series including the pass gate in the latch, and the sense amplifier or the logic tree of the proceeding stage. In the SSIL's 100 and 200, however, the first storage node S1 is connected to appropriate rails through transistor P2 or N3, leading to an improved speed due to reduced conductive distance. The additional speed gain of dual-rail version 200 may come from simultaneous evaluation of logic values at both the inverting and noninverting signals at the output nodes OUT and /OUT.

As per power consumption, the clock loads of both SSIL's 100 and 200 are far smaller than that of the latch 80, as listed in Table I, leading to a reduction in power consumption. The clock signal is the busiest signal consuming the largest power. Lack of short-circuit current through the transistors P2 and N3 may be another reason for power-efficient operation of SSIL.

The foregoing embodiment is merely exemplary and not to be construed as limiting the present invention. The present scheme can be readily applied to other types of logic cells and devices. One of ordinary skill in the art can use the teachings of the present invention to provide other devices requiring reduced power consumption. The description of the present invention is intended to be illustrative, and not limiting the scope of the claims. Many alternatives, modifications and variations will be apparent to those skilled in the art.

I claim:

1. A storage device, responsive to an input signal of first, second and third signal levels and control signal of said first and said third signal levels, comprising:

a) a first plurality of transistors;
b) a first pair of transistors coupled to said first plurality of transistors and coupled to each other at a first storage node; and
c) a second pair of transistors coupled to each other at the first storage node, wherein said first plurality of transistors comprises first, second and third field effect transistors, each having a control electrode and first and second electrodes, said first and second electrodes of said second field effect transistor being coupled to said second electrode of said first field effect transistor at a first node and said first electrode of said third field effect transistor at a second node, respectively, and said control electrode of said second field effect transistor coupled for receiving the control signal, and the control electrodes of said first and third transistors coupled for receiving the input signal.

2. The storage device of claim 1, wherein said first pair of transistors comprises fourth and fifth field effect transistors, each having a control electrode and first and second electrodes, said first and second electrodes of said fourth and fifth field effect transistors, respectively, are coupled to one another at the first storage node, and the control electrodes of said fourth and fifth field effect transistors are coupled, respectively, to the first and second nodes.

3. The storage device of claim 2, wherein said second pair of transistors comprises sixth and seventh field effect transistors, each having a control electrode and first and second electrodes, said first electrode of said seventh transistor and said second electrode of said sixth transistor being coupled to the first storage node, and control the electrodes of said sixth and seventh field effect transistors being coupled to a second storage node.

4. The storage device of claim 3, further comprising a third pair of transistors coupled to the first storage node and each transistor of said third pair of transistors being coupled to each other at the second storage node.

5. The storage device of claim 1, wherein each of said first and second pairs of transistors include a control electrode and first and second electrodes, control electrodes of said second pair of transistors being coupled to a second storage node, and first and second electrodes of corresponding transistors of said first pair of transistors being coupled to the first storage node.

6. The storage device of claim 5 further comprising a third pair of transistors, said third pair comprising eighth and ninth transistors, each having a control electrode and first and second electrodes, said control electrodes of eighth and ninth transistors being coupled to the first storage node, and wherein said first and second electrodes of said ninth and eighth transistors, respectively, are coupled the second storage node.

7. The storage device of claim 1 further comprising a third pair of transistors coupled to said second pair of transistors to form a cross-coupled inverter.

8. The storage device of claim 7, wherein each transistor of said second and third pairs of transistors each includes a control electrode and first and second electrodes, said control electrodes of said second pair of transistors being coupled to a second storage node, and the control electrodes of said third pair of transistors being coupled to the first storage node.

9. The storage device of claim 8, wherein one of said first and second electrodes of each transistor of said second pair of transistors is coupled to the first storage node, and one of said first and second electrodes of each transistor of said third pair of transistors is coupled to the second storage node.

10. The storage device of claim 1 further comprising tenth and eleventh transistors coupled to said second pair of transistors and coupled to be responsive to a complement of the input signal.

11. The storage device of claim 10 further comprising a third pair of transistors cross-coupled to said second pair of transistors to form a cross-coupled inverter.

12. The storage device of claim 1 further comprising a third pair of transistors coupled to said second pair of transistors at the first node and a second node to form a cross-coupled inverter.

13. The storage device of claim 12, wherein said third pair of transistors are coupled to said first plurality of transistors.

14. The storage device of claim 12 further comprising a second plurality of transistors coupled to said second pair of transistors.

15. The storage device of claim 14 further comprising a fourth pair of transistors coupled to the second storage node.

16. The storage device of claim 14, wherein said second plurality of transistors comprises tenth and eleventh transistors, each having a control electrode and first and second electrodes, said second electrode of said tenth transistor and said first electrode of said eleventh transistor being coupled to said second pair of transistors at third and fourth nodes, respectively, and said control electrodes of said tenth and eleventh transistors coupled for receiving a complement of the input signal.

17. The storage device of claim 16, wherein said second plurality of transistors further comprises a twelfth transistor coupled in series between said tenth and eleventh transistors and coupled for receiving the control signal.

18. The storage device of claim 16 further comprising a fourth pair of transistors, said fourth pair includes thirteenth and fourteenth transistors, each having a control electrode and first and second electrodes, said first and second electrodes of fourteenth and thirteenth transistors, respectively, being coupled to the second storage node, and said control electrodes of said thirteenth and fourteenth transistors being coupled, respectively, to the third and fourth nodes.

19. The storage device of claim 17 further comprising a fourth pair of transistors coupled to the second storage node.

20. The storage device of claim 12, further comprising a second plurality of transistors coupled to said second pair of transistors, and said third pair of transistors are coupled to said first plurality of transistors.

21. The storage device of claim 20, wherein said first pair of transistors are coupled in series at the first storage node and said control electrodes of said first pair of transistors are coupled to said first plurality of transistors and said third pair of transistors.

22. The storage device of claim 21, wherein said second plurality of transistors comprises tenth, eleventh and twelfth transistors, each having a control electrode and first and second electrodes, said second electrode of said tenth transistor and said first electrode of said eleventh transistor being coupled to said second pair of transistors at third and fourth nodes, respectively, and said control electrodes of said tenth and eleventh transistors coupled for receiving a complement of the input signal, said twelfth transistor coupled in series between said tenth and eleventh transistors and coupled for receiving the control signal at its control electrode.

23. The storage device of claim 22 further comprising a fourth pair of transistors, said fourth pair includes thirteenth and fourteenth transistors, each having a control electrode and first and second electrodes, said first and second electrodes of said fourteenth and thirteenth transistors, respectively, being coupled to the second storage node, and said control electrodes of said thirteenth and fourteenth transistors being coupled, respectively, to the third and fourth nodes.

24. A storage element for a semiconductor device comprising:
   a) an input electrode for receiving an input signal of one of first, second and third signal levels;
   b) a control input electrode for receiving a control signal of one of first and third signal levels;
   c) a first circuit that maintains a first storage node at a same signal level of a previous state when the input signal at said input electrode transits from one of (i) first signal level to second signal level and (ii) third signal level to second signal level, wherein said first circuit includes a first plurality of transistors coupled to the input electrode, and a first pair of transistors coupled to said first plurality of transistors and coupled to each other at the first storage node; and
   d) a second circuit, coupled to said first circuit, that changes a condition of said first storage node to one of (i) first signal level when the input signal transits from the second signal level to the first signal level and (ii) third signal level when the input signal transits from the second signal level to the third signal level.

25. The storage element of claim 24, wherein the second signal level has a magnitude between the first and third signal levels.

26. The storage element of claim 25, wherein the magnitude of the second signal level is about one-half the difference in magnitude between the first and third signal levels.

27. The storage element of claim 24, wherein said second circuit comprises:
   a second pair of transistors coupled to the first storage node; and
   a third pair of transistors coupled to a second storage node, said second pair of transistors being coupled to the second storage node and said third pair of transistors coupled to said first storage node such that said second and third pair of transistors form a cross-coupled inverter.

28. The storage element of claim 27, wherein said first circuit further comprises a second plurality of transistors coupled to the input electrode, a corresponding transistor of said second plurality of transistors being coupled to a corresponding transistor of said second pair of transistors.

29. The storage element of claim 28, wherein said first pair of transistors are coupled to said first plurality of transistors and said third pair of transistors, and said second plurality of transistor coupled to the control input electrode.

30. The storage element of claim 29, wherein said first circuit further comprises a fourth pair of transistors coupled to said second plurality of transistors, said second pair of transistors and the second storage node.

31. A method for storing one of first and third signal levels at first and second storage nodes, respectively, in response to an input signal of one of first, second and third signal levels and a control signal of one of first and third levels, the second signal level having a magnitude in-between the first and third signal levels, the method comprising the steps of:
   maintaining a first storage node at a same signal level of a previous state when the input signal transits from one of (i) first signal level to second signal level and (ii) third signal level to second signal level; and
   changing a condition of said first storage node to one of (i) first signal level when the input signal transits from the second signal level to the first signal level and (ii) third signal level when the input signal transits from the second signal level to the third signal level.

* * * * *